(12) United States Patent
Ohashi

(10) Patent No.: US 8,147,646 B2
(45) Date of Patent: Apr. 3, 2012

(54) SEMICONDUCTOR DEVICE PRODUCING METHOD

(75) Inventor: Yukihiko Ohashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 429 days.

(21) Appl. No.: 12/394,883

(22) Filed: Feb. 27, 2009

(65) Prior Publication Data

US 2009/0321014 A1 Dec. 31, 2009

(30) Foreign Application Priority Data

Jun. 26, 2008 (JP) ................. 2008-167369

(51) Int. Cl.
*C09J 5/00* (2006.01)
*B29C 65/00* (2006.01)

(52) U.S. Cl. .............................. 156/305; 29/464; 29/832

(58) Field of Classification Search .................. 156/285, 156/305; 269/47.49, 48, 48.1; 29/464, 468, 29/832, 466

See application file for complete search history.

(56) References Cited

U.S. PATENT DOCUMENTS 6,323,263 B1 * 11/2001 Kuwabawa et al. .......... 523/443

FOREIGN PATENT DOCUMENTS

| CN | 101111687 A | 1/2008 |
|---|---|---|
| CN | 101193498 A | 6/2008 |
| JP | 10-86958 A | 4/1998 |
| JP | 2000-138253 A | 5/2000 |
| JP | 2000-150775 A | 5/2000 |
| KR | 20-0159188 Y1 | 10/1999 |
| KR | 10-0606565 B1 | 7/2006 |

OTHER PUBLICATIONS

Korean Office Action dated Nov. 5, 2010, issued in corresponding Korean Patent Application No. 10-2009-0016228.
Chinese Office Action dated Mar. 7, 2011, issued in corresponding Chinese Patent Application No. 200910117994.4.
Chinese Office Action dated Sep. 30, 2010, issued in corresponding Chinese Patent Application No. 200910117994.4.

* cited by examiner

*Primary Examiner* — John Goff
(74) *Attorney, Agent, or Firm* — Westerman, Hattori, Daniels & Adrian, LLP

(57) ABSTRACT

A semiconductor device producing method includes: vacuum-adsorbing a printed substrate on a vacuum adsorption surface of a stage with the printed substrate being pressed on the vacuum adsorption surface; temporarily fixing the printed substrate on the stage by commonly inserting a pin to a through hole formed in the printed substrate and a hole formed in the stage; and releasing the vacuum adsorption.

2 Claims, 11 Drawing Sheets

SEMICONDUCTOR DEVICE PRODUCING METHOD

CROSS-REFERENCE TO RELATED APPLICATION

This application is based upon and claims the benefit of priority of the prior Japanese Patent Application No. 2008-167369, filed on Jun. 26, 2008, the entire contents of which are incorporated herein by reference.

FIELD

The embodiment discussed herein is related to a semiconductor device producing method, a semiconductor device producing apparatus, and a pin.

BACKGROUND

Conventionally, there has been known a mounting method for mounting a semiconductor chip on a printed substrate (hereinafter referred to as substrate). In a process for mounting the semiconductor chip on the substrate, in order to ensure the joining strength and positional accuracy between the substrate and the semiconductor chip, it is preferable to mount the semiconductor chip with the warpage of the substrate corrected. As a technique for correcting for correcting the warpage of the substrate, a conceivable method is to absorb the substrate on the plate-shaped stage by vacuum adsorption to correct the warpage. Further, as other techniques, the substrate on which the semiconductor chip is not mounted is pressed on the stage, or a gel-like material having adhesion coats the stage to use the adhesive force in order to correct the warpage of the substrate. The correction of the substrate warpage has to be performed until an underfill material, which is filled between the substrate and the semiconductor chip mounted on the substrate, is hardened.

However, in a case where the substrate is corrected by the vacuum adsorption, a larger adsorptive force may be needed, since a restoring force against the correction of the warpage becomes larger depending on the thickness of the substrate. In this case, the cost of a producing apparatus is increased, because a vacuum pomp having a strong adsorptive force is needed. In order to ensure the strong adsorptive force, ingenuity is demanded for the number of vacuum holes and the arrangement thereof formed on the stage. This also increases the cost of the stage.

In another case where the warpage is corrected by pressing the substrate to the stage, no semiconductor chips can be mounted at the contact area in which the substrate comes into contact with a pressing member for pressing the substrate. This leads the mounting area of the substrate to be smaller, thereby to increases the cost thereof.

In the case where the warpage is corrected by the adhesive force, the maintenance for the gel-like material is periodically needed to prevent the adhesive force from reducing, thereby increasing the cost.

SUMMARY

According to an aspect of the embodiment, a semiconductor device producing method includes: vacuum-adsorbing a printed substrate on a vacuum adsorption surface of a stage with the printed substrate being pressed on the vacuum adsorption surface; temporarily fixing the printed substrate on the stage by commonly inserting a pin to a through hole formed in the printed substrate and a hole formed in the stage; and releasing the vacuum adsorption.

Therefore, the warpage of the printed substrate can be corrected at a low cost to flatly shape the printed substrate on the stage.

The object and advantage of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

A description will be given of an embodiment below.

Figure 1:
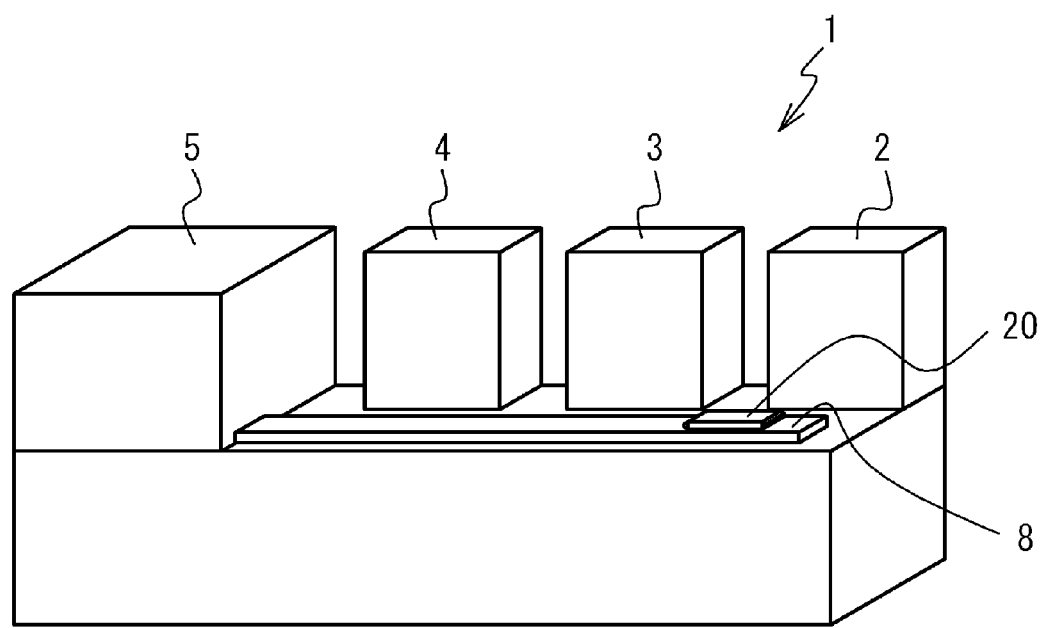
FIG. 1 is a schematic view of a semiconductor device producing apparatus for producing a semiconductor device.

FIG. 1 is a schematic view of a semiconductor device producing apparatus 1 for producing a semiconductor device. The semiconductor device producing apparatus 1 includes: a correcting mechanism portion 2 correcting warpage of a substrate 10 mentioned below; a mounting mechanism portion 3 mounting a semiconductor chip 18 on the substrate 10; an underfill applying mechanism portion 4 applying an underfill material; and a thermal cure oven 5 hardening the underfill material. A stage 20 is transferred to each portion by a rail 8.

Figure 2A:
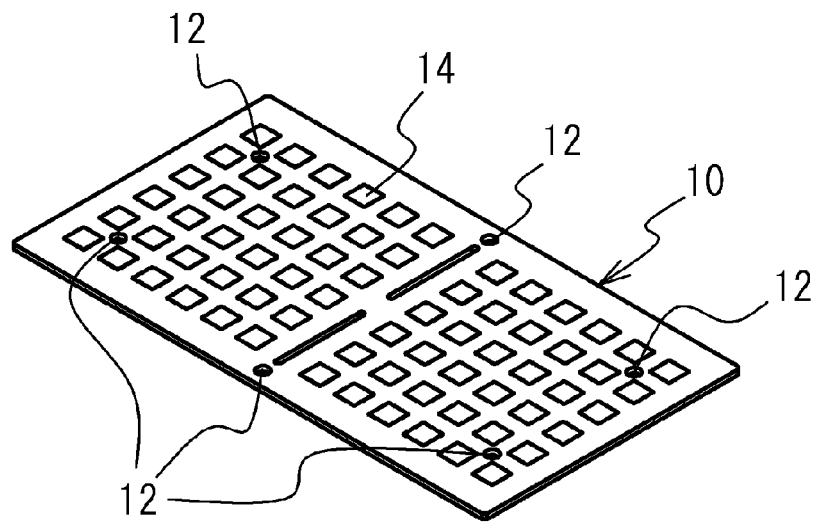
FIGS. 2A and 2B are perspective views of a substrate and a stage.
Figure 2B:
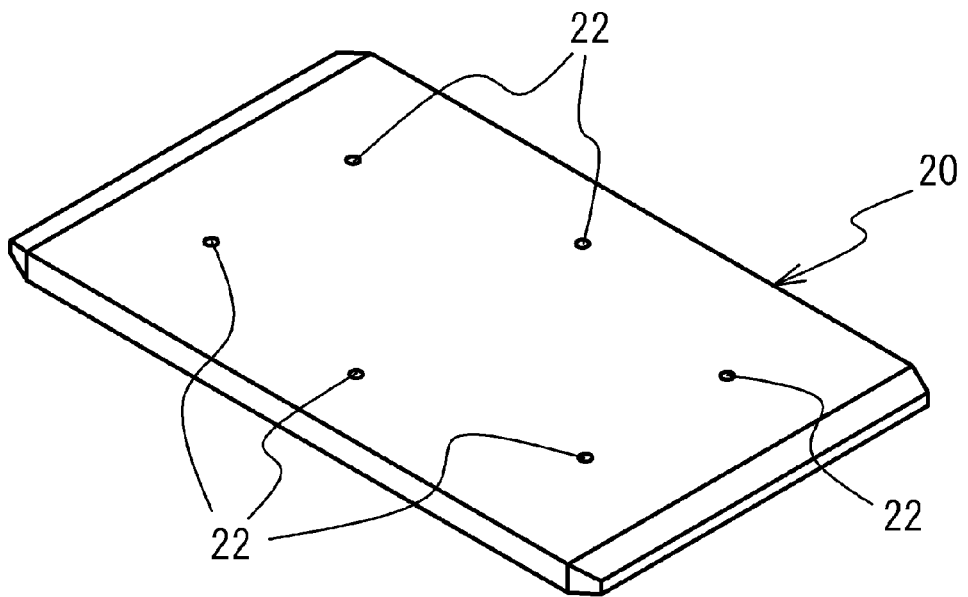

FIGS. 2A and 2B are perspective views of the substrate 10 and the stage 20. The substrate 10 is a printed substrate made of a glass epoxy resin with insulation properties. The substrate 10 may be made of a ceramic or glass polyimide resin. The substrate 10 has a length of about 150 mm, a width of about 80 mm, and a thickness of about 0.3 mm. However, the size of the substrate 10 is not limited. Additionally, the substrate 10 is provided with through holes 12 for flatly shaping the substrate 10 on the stage 20. Six through holes 12 are provided in the substrate 10. Additionally, mounting areas 14, for mounting plural semiconductor chips mentioned below, are provided in a grid manner on one surface of the substrate 10. The through holes 12 are formed to be evacuated from the mounting areas 14 or to be between the mounting areas 14.

The stage 20 is capable of transferring the substrate 10 to the correcting mechanism portion 2, the mounting mechanism portion 3, the underfill applying mechanism portion 4, and the thermal cure oven 5. The stage 20 has a plate shape.

Also, six through holes 22 are formed in the stage 20. The locations of the through holes 22 respectively correspond to those of the through holes 12. Further, the through hole 22 penetrates through the stage 20. However, a blind hole that dose not penetrate through the stage 20 may be employed.

Next, a description will be given of a method for producing the semiconductor device. FIGS. 3A to 11 are explanatory views of the method for producing the semiconductor device.

Figure 3A:
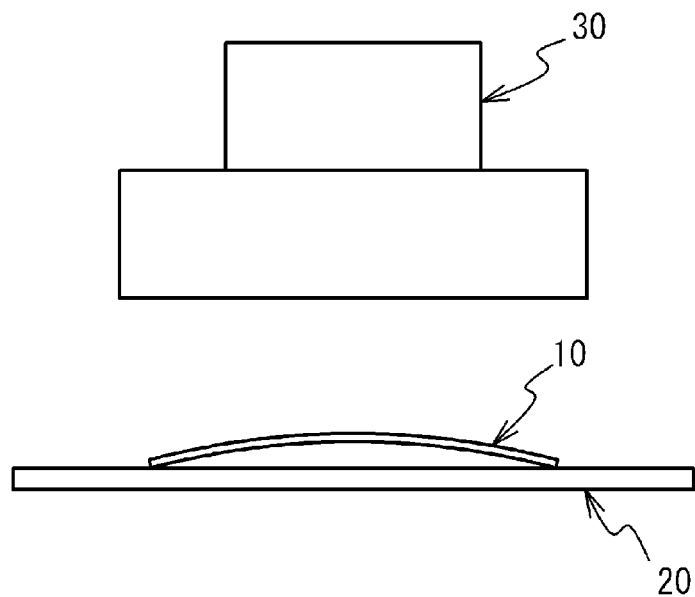
FIGS. 3A and 3B are explanatory views of a process for adsorbing the substrate on the stage.

First, a description will be given of a process for pressing the substrate 10 on a vacuum adsorption surface of the stage 20 and to adsorb the substrate 10. As illustrated in FIG. 3A, the substrate 10 is arranged on an upper surface of the stage 20 in the correcting mechanism portion 2. The warpage of the substrate 10 occurs as illustrated in FIG. 3A. The alignment of the substrate 10 with the stage 20 is achieved by image processing using an imaging camera. Additionally, the alignment method is not limited to the above one. For example, alignment projections provided on the stage 20 may be engaged with cutouts or holes provided in the substrate 10.

Figure 3B:
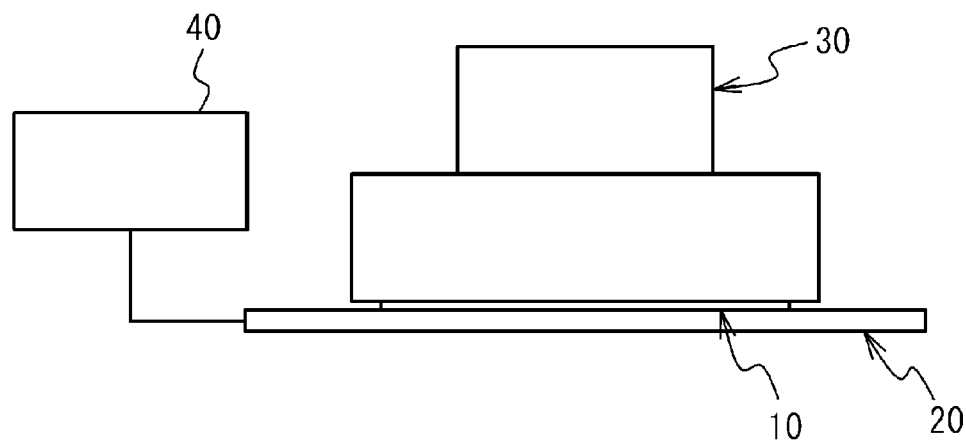

The correcting mechanism portion 2 is equipped with a pressing head 30. The pressing head 30 is made of a metal in a block shape. Referring to FIGS. 3A and 3B, the substrate 10 is pressed on the stage 20 by the pressing head 30. The substrate 10 is flatly shaped on the stage 20 by the pressing force to correct the warpage.

A vacuum pump 40 is actuated with the substrate 10 being pressed by the pressing head 30. The vacuum pump 40 communicates with the stage 20 via a hose (not illustrated) or the like. The substrate 10 is vacuum absorbed on the stage 20 by actuating the vacuum pump 40.

Figure 4A:
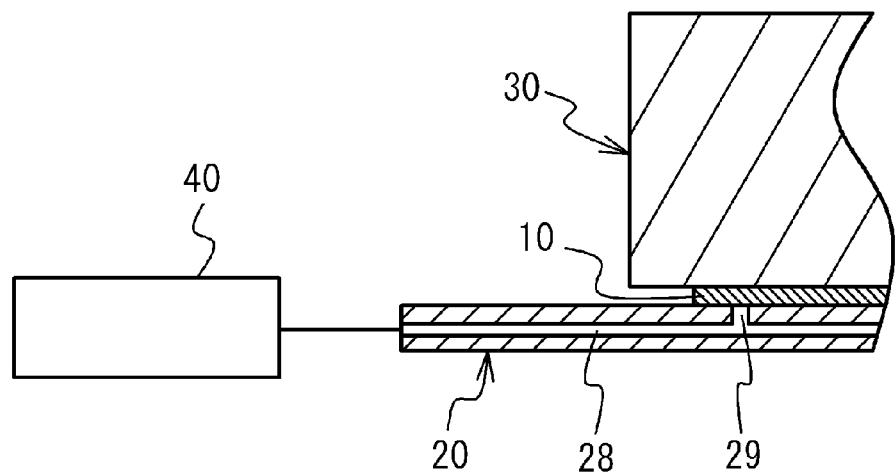
FIGS. 4A and 4B are explanatory views of a process for adsorbing the substrate on the stage.
Figure 4B:
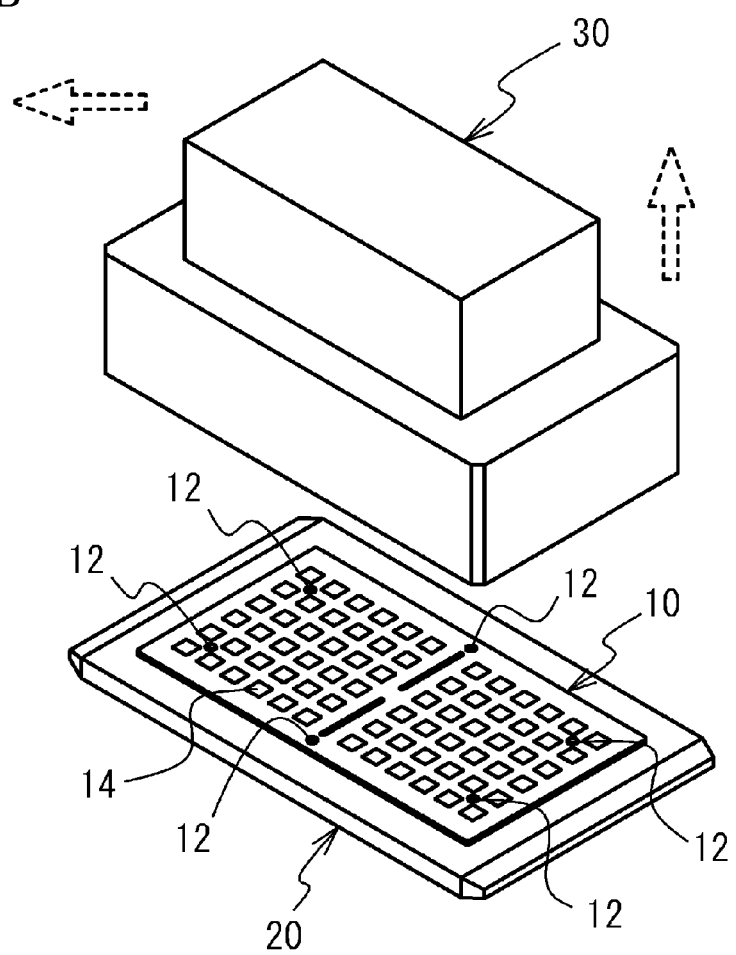

FIG. 4A is an explanatory view of the vacuum adsorption and illustrates a cross-sectional configuration of the stage 20. A suction passage 28 and a suction hole 29 communicated with each other are provided in the stage 20. The suction hole 29 penetrates to the upper surface of the stage 20. Additionally, the suction hole 29 is omitted in FIG. 2B and in other drawings. A diameter of the suction hole 29 is smaller than that of the through hole 22. The suction passage 28 and the suction hole 29 are brought into a vacuum state by the actuation of the vacuum pump 40. An adsorption force generated in response thereto allows the substrate 10 to be absorbed on the stage 20. Therefore, the upper surface of the stage 20 corresponds to the vacuum adsorption surface. In addition, the stage 20 may be provided with a suction channel instead of the suction hole.

The vacuum pump 40 is continuously actuated, so the pressing head 30 is receded from the substrate 10. Since the vacuum pump 40 is actuated even when the pressing head 30 is receded, the substrate 10 is maintained to be absorbed on the stage 20. Thus, the substrate 10 is absorbed and held on the stage 20 in the state in which the warpage is corrected.

The adsorption force of the vacuum pump 40 is set to the extent in which the warped substrate 10 cannot be flatly shaped on the stage 20 by only the adsorption force. In other words, the substrate 10 is pressed on the stage 20 by the pressing head 30 so as to be forcibly and flatly shaped on the stage 20. By actuating the vacuum pump 40 in this state, the substrate 10 is absorbed on the stage 20. As mentioned above, the vacuum pump 40 having a weak adsorption force may be employed.

Moreover, since the pressing head 30 corrects the substrate 10, the substrate 10 is allowed to be absorbed on the stage 20 without devising a shape of the suction passage 28, the number of the suction hole 29, and the positions of the suction hole 29, in order to improve the adsorption force of the vacuum pump 40. This reduces the manufacturing cost of the stage 20.

Figure 5A:
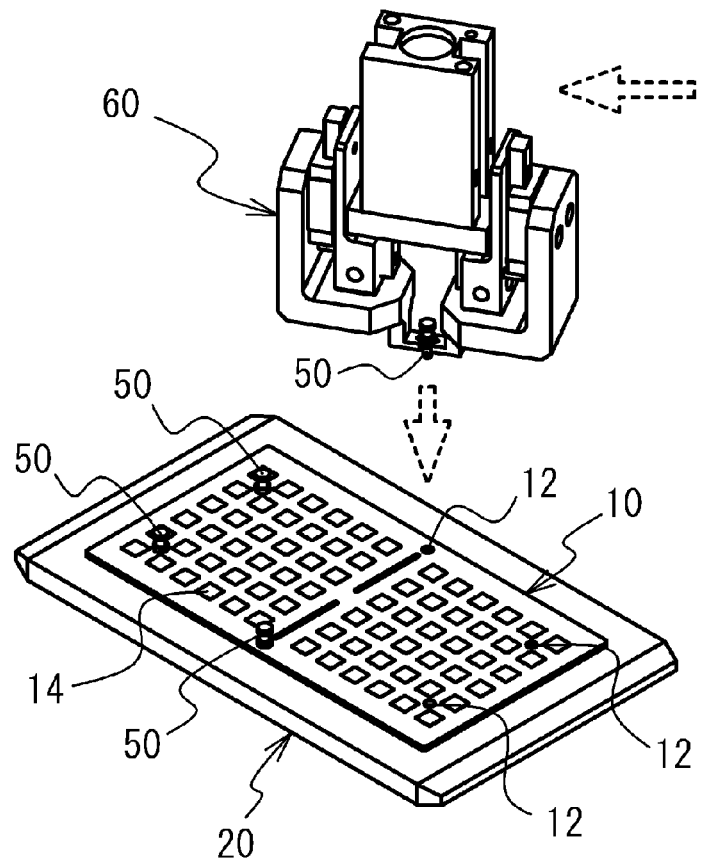
FIGS. 5A and 5B are explanatory views of a process for temporarily fixing the substrate on the stage by a pin.
Figure 5B:
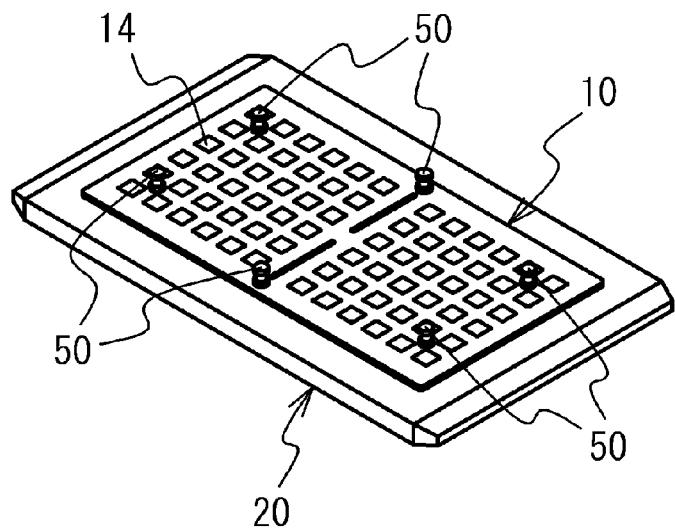

Next, a description will be given of a process for temporarily fixing the substrate 10 on the stage 20 by a pin 50. As illustrated in FIG. 5A, the pin 50 is inserted into the through hole 12 by an inserting and removing hand (inserting and removing member) 60. At this time, the pin 50 is commonly inserted into the through holes 12 and 22. As illustrated in FIG. 5B, the six pins 50 are inserted, thereby temporarily fixing the substrate 10 on the stage 20. Additionally, the correcting mechanism portion 2 is equipped with the inserting and removing hand 60 which is capable of moving up and down.

Figure 6C:
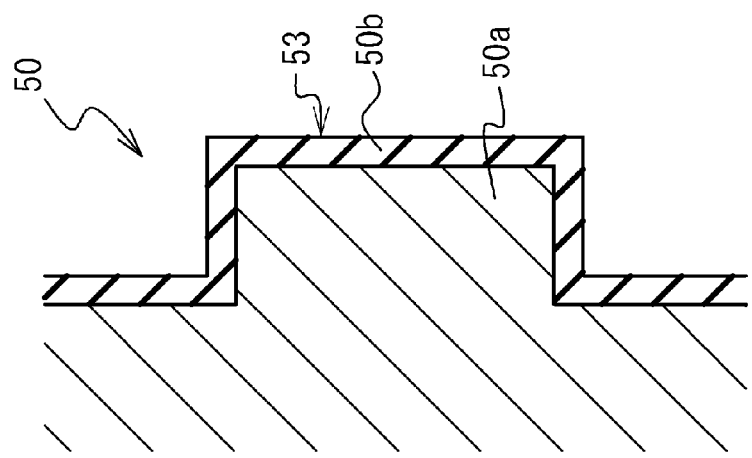
FIGS. 6A to 6C are explanatory views of the pin.
Figure 6B:
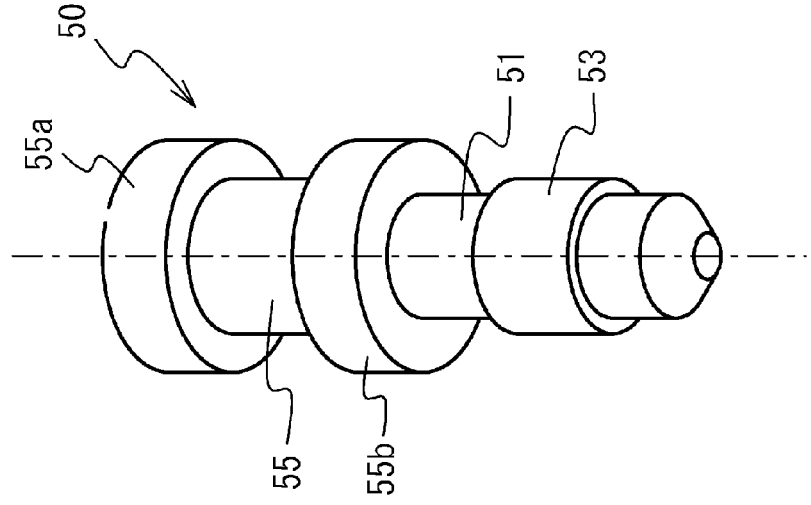
Figure 6A:
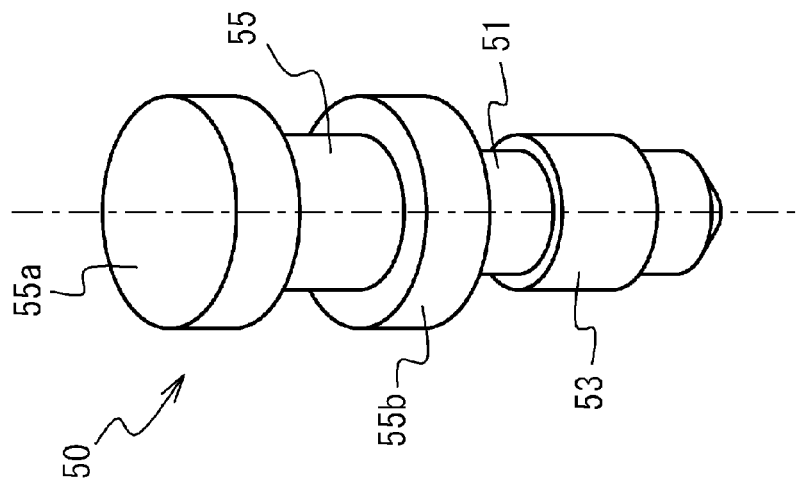

FIGS. 6A and 6B are perspective views of the pin 50. FIG. 6C is a partially cross-sectional view of the pin 50. The pin 50 includes a body portion 51, a stopper portion 53, and a flange portion 55. The body portion 51 has a cylindroid shape. The stopper portion 53 is formed at a partway of the body portion 51 and is larger than the body portion 51 in the radial direction. The flange portion 55 is formed at an upper end of the body portion 51. The flange portion 55 includes circular plate portions 55a and 55b which are arranged in the axial direction via a step. Each of the circular plate portions 55a and 55b has a substantially identical shape and is larger than any other portion. Further, the diameter of the body portion 51 is about 1 mm, and the entire length of the pin 50 is about 8 mm.

As illustrated in FIG. 6C, a core material 50a of the pin 50 is made from a non-elastic material. Specifically, the core material 50a is made from a metallic material such as a stainless steel having rigidity. Additionally, the core material 50a is not limited to be made from a metallic material, and may be made from an engineering plastic having rigidity. A coating layer 50b is formed at the outer surface of the core material 50a by coating the core material 50a. The coating layer 50b is made of an elastic material having heat resistance. In particular, the coating layer 50b is made of rubber such as silicon rubber or fluoro-rubber. Moreover, the rubber having heat resistance is employed, because both the substrate 10 and the pin 50 are heated in a process for hardening an underfill mentioned below.

Figure 7A:
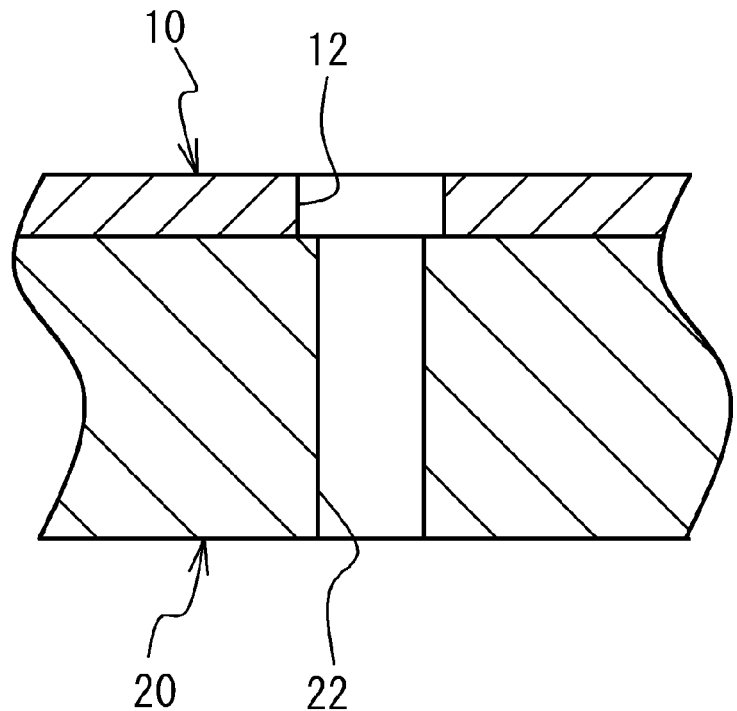
FIGS. 7A and 7B are explanatory views of the insertion of the pin.
Figure 7B:
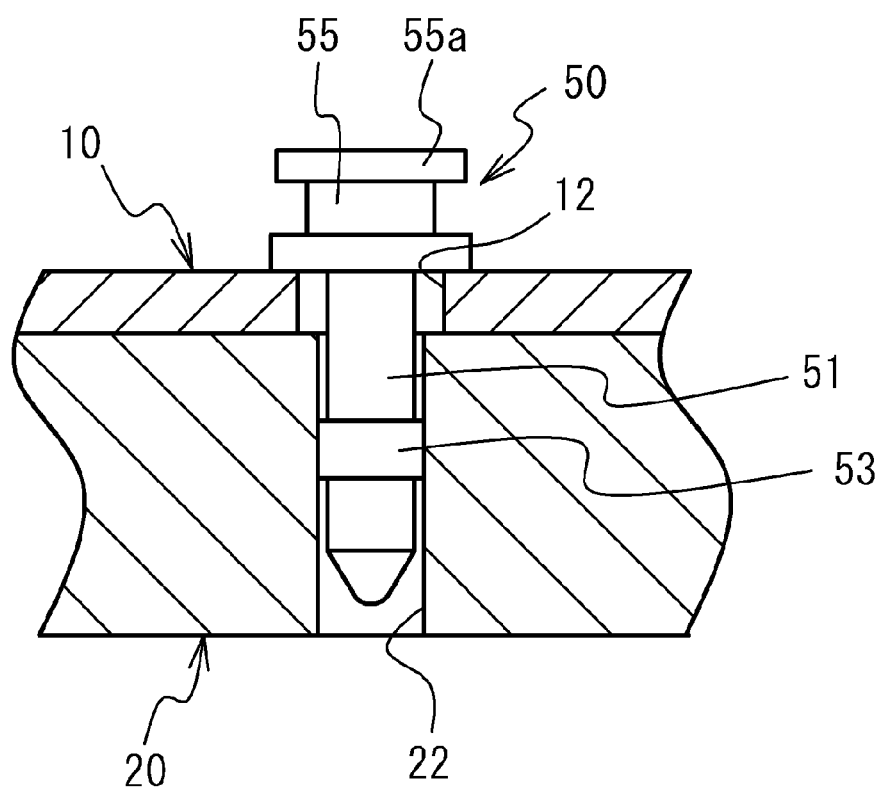

A description will be given of the insertion of the pin 50. FIGS. 7A and 7B are explanatory views of the insertion of the pin 50. FIG. 7A illustrates a cross section of the substrate 10 and the stage 20 before the pin 50 is inserted. FIG. 7B illustrates a cross section of the substrate 10 and the stage 20 when the pin 50 is inserted.

As illustrated in FIG. 7A, the diameter of the through hole 12 is slightly larger than that of the through hole 22. This is because a position error of the substrate 10 and the stage 20 is considered. If the through holes 12 and 22 are similar to each other in the diameter, it may be difficult for the pin 50 to be inserted depending on the position error.

As illustrated in FIG. 7B, the pin 50 is commonly inserted into the through holes 12 and 22, whereby the body portion 51 is inserted into the through holes 12 and 22. The diameter of the body portion 51 is smaller than those of the through holes 12 and 22. At this time, the inserting position is defined by the flange portion 55. In other words, the circular plate portion 55b abuts with a peripheral portion of the through hole 12, thereby defining the inserting position of the pin 50 in the axial direction. That is to say, the diameter of the circular plate portion 55b is larger than that of the through hole 12. Further, the diameter of the stopper portion 53 is slightly larger than that of the through hole 22.

Since the stopper portion 53 is slightly larger than that of the through hole 22, when the pin 50 is inserted into the through holes 12 and 22, the coating layer 50b of the stopper portion 53 is slightly compressed. For this reason, the stopper portion 53 and the through hole 22 are fixed by an elastic restoring force of the coating layer 50b. Accordingly, the pin 50 is maintained to be inserted into the through holes 12 and 22.

The coating layer 50b is the rubber having elasticity, mentioned above, however, the core material 50a is made from a material having rigidity. If the entire pin 50 is made of an elastic material such as rubber, when the pin 50 is inserted into the through holes 12 and 22, the sliding resistance becomes so large that the insertion may be difficult. However, if the entire pin 50 is made of a metal or the like, the insertion into the through holes 12 and 22 is facilitated, but the pin 50 may be removed from the through holes 12 and 22. Therefore, by forming the coating layer 50b made from an elastic material on the outer surface of the core material 50a having rigidity, the insertion of the pin 50 is facilitated and the removal of the pin 50 is prevented.

In addition, the inserting and removing hand 60 grasps the flange portion 55 of the pin 50 and inserts the pin 50 into the through holes 12 and 22. Further, when the pin 50 is removed as will be discussed later, the inserting and removing hand 60 grasps the flange portion 55. The flange portion 55 has a function of defining a depth of the insertion, and also the flange portion 55 facilitates the inserting and removing operation of the inserting and removing hand 60.

Further, it is not preferable to employ a screw, instead of the pin 50. In a case where the screw is employed, the screw is screwed into a screw hole of the substrate to cut the screw hole, so that chippings may be generated.

Next, a description will be given of a process for releasing the vacuum adsorption. The actuation of the vacuum pump 40 is stopped, while the substrate 10 is being temporarily fixed on the stage 20 by the pin 50. The substrate 10 is temporarily fixed on the stage 20 with the warpage of the substrate 10 corrected by the pin 50, the warpage of the substrate 10 is not caused even when the actuation of the vacuum pump 40 is stopped.

In this manner, the substrate 10 is temporarily fixed on the stage 20 with the warpage of the substrate 10 corrected by the pin 50, thereby shortening the actuation period of the vacuum pump 40. In a case where the substrate 10 is absorbed on the stage 20 by only the actuation of the vacuum pump 40 without using the pin 50, it is necessary for the vacuum pump 40 to keep actuating until a process for thermally hardening an underfill material mentioned below. However, since the temporal fixation by the pin 50, mentioned above, allows the vacuum pump 40 to stop actuating early. This reduces the cost associated with the actuation of the vacuum pump 40.

Further, in order to keep actuating the vacuum pump 40 until the process for thermally hardening the underfill material, it is necessary to ensure the connection of the stage 20 with the vacuum pump 40 until the stage 20 reaches the thermal cure oven 5. When such a connection is constantly ensured, a mechanism for this connection is so complicated so that the cost of the producing apparatus will be increased. However, as mentioned above, the vacuum pump 40 is actuated only while the stage 20 is transferred in the correcting mechanism portion 2. For this reason, the substrate 10 is not necessarily vacuum absorbed to the stage 20 in the mounting mechanism portion 3, the underfill applying mechanism portion 4, and the thermal cure oven 5. The equipment for this vacuum adsorption is not needed to be provided.

Figure 8A:
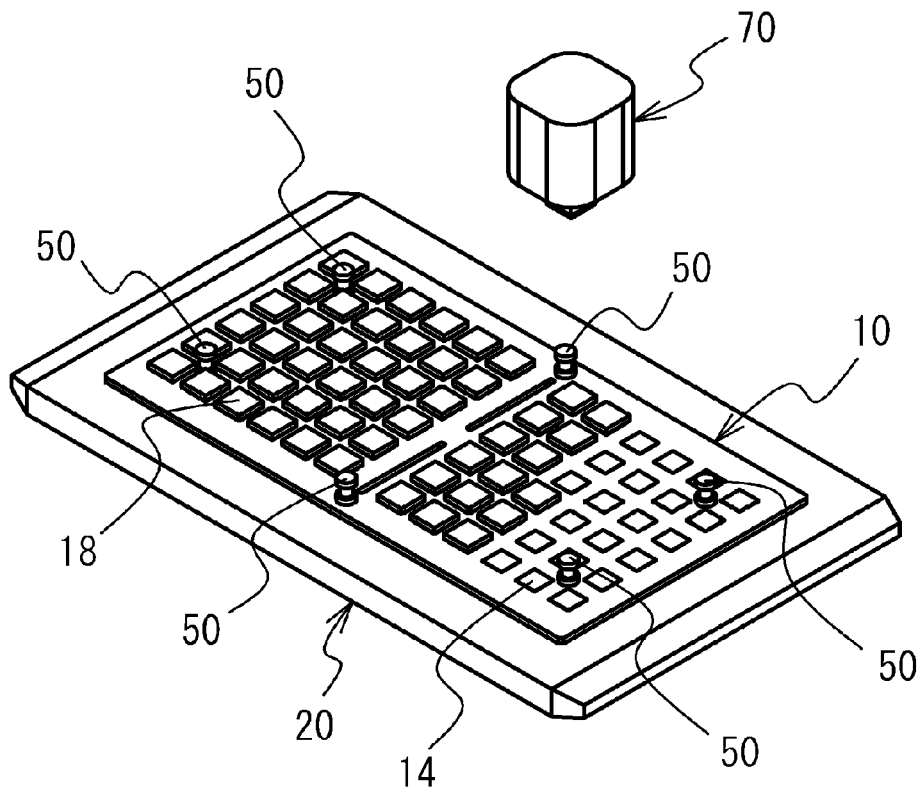
FIG. 8A is an explanatory view of a process for mounting semiconductor chips on the substrate.

Next, a description will be given of a process for mounting the semiconductor chip 18 on the substrate 10. FIG. 8A is an explanatory view of the mounting process. The stage 20 is transferred to the mounting mechanism portion 3, and then the semiconductor chip 18 is mounted on the mounting area 14 of the substrate 10 by a chip mounting head 70. The mounting mechanism portion 3 is equipped with the chip mounting head 70. The chip mounting head 70 holds the semiconductor chip 18 with an adsorption force. In the mounting of the semiconductor chip 18, an electrode (not illustrated), provided in the mounting area 14, for connection, a solder bump (not illustrated), provided in the semiconductor chip 18, are pressure bonded. At the bonding, a heater (not illustrated) arranged at the bottom surface of the stage 20 is activated to heat the entire substrate 10. The mounting mechanism portion 3 is equipped with the heater. When all of the semiconductor chips 18 are mounted, the operation of the heater is stopped.

Figure 8B:
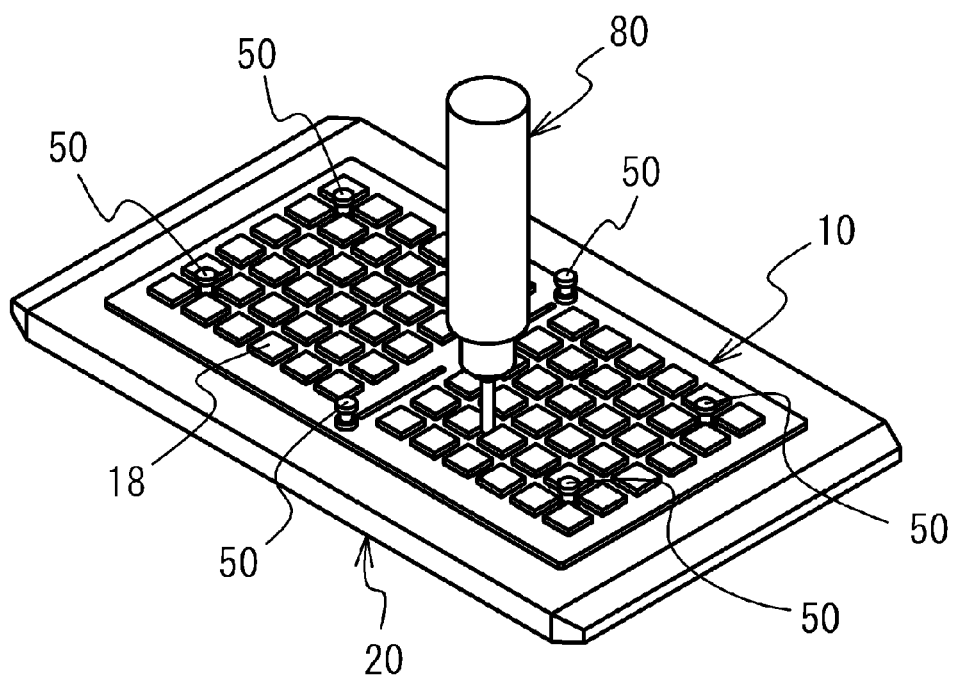
FIG. 8B is an explanatory view of a process for filling an underfill material.

Next, a description will be given of a process for filling the underfill material between the substrate 10 and the semiconductor chip 18. FIG. 8B is an explanatory view of the process for filling the underfill material. After the plural semiconductor chips 18 are mounted on the substrate 10, the stage 20 is transferred to the underfill applying mechanism portion 4. The underfill applying mechanism portion 4 is equipped with a filling nozzle 80. The underfill material which is a liquid resin is filled between the substrate 10 and the plural semiconductor chips 18 by the filling nozzle 80. Specifically, the underfill material is poured into the clearances between the plural semiconductor chips 18. After the underfill material is filled between all of the semiconductor chips 18 and the substrate 10, the stage 20 is transferred to the thermal cure oven 5.

Figure 9:
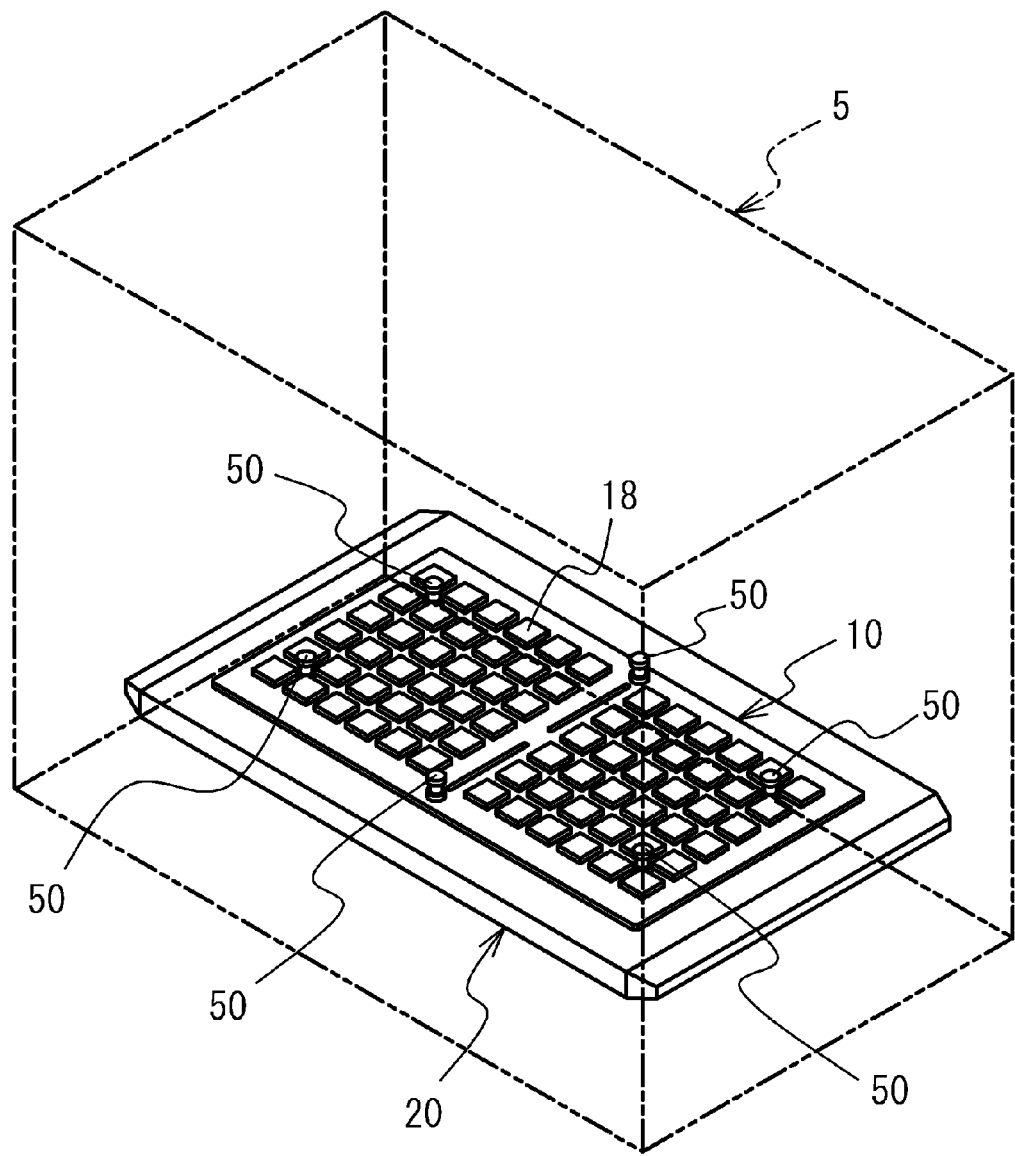
FIG. 9 is an explanatory view of the process for thermally hardening the underfill material.

Next, a description will be given of a process for thermally hardening the underfill material. FIG. 9 is an explanatory view of the process for thermally hardening the underfill material. The stage 20 is transferred to the thermal cure oven 5. The temperature within the thermal cure oven 5 is set at about 200 to about 250 degrees Celsius. The substrate 10 is placed within the thermal cure oven 5 for a predetermined period, so that the underfill material is thermally hardened. Additionally, the pin 50 is heated together with the substrate 10.

Figure 10A:
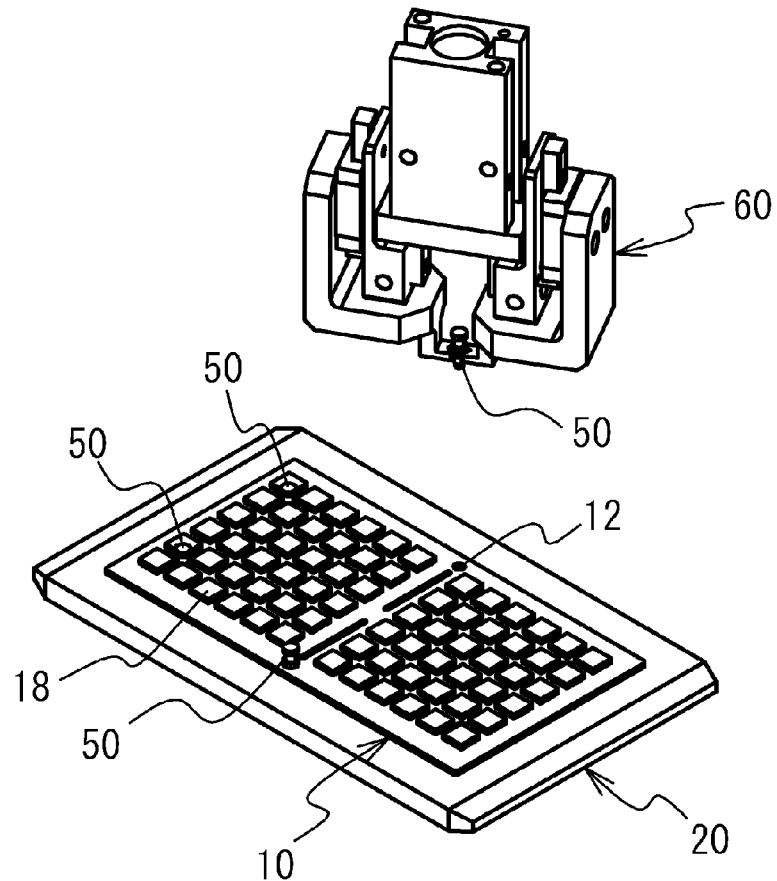
FIGS. 10A and 10B are explanatory views of the process for removing the pin.
Figure 10B:
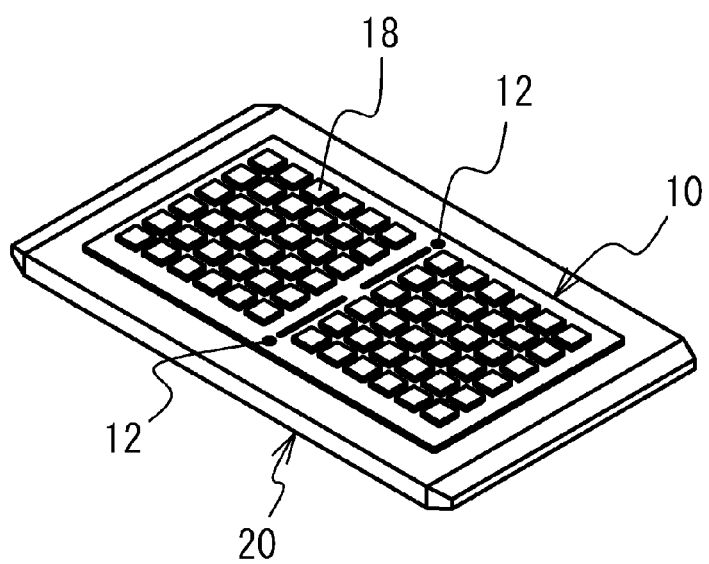
Figure 11:
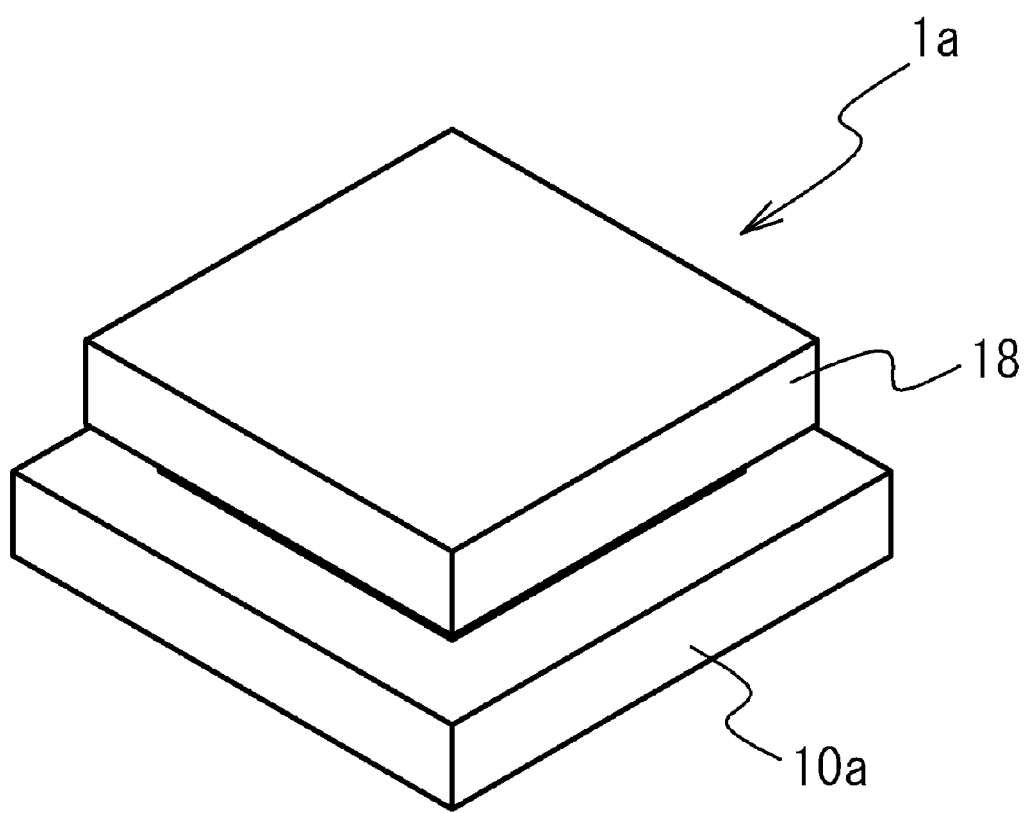
FIG. 11 is a perspective view of the semiconductor device.

Next, a description will be given of a process for removing the pin 50 after the underfill material is hardened. FIGS. 10A and 10B are explanatory views of the process for removing the pin 50. After the underfill material is hardened, the stage 20 is transmitted to the correcting mechanism portion 2 and the pin 50 is removed by the inserting and removing hand 60 as illustrated in FIG. 10A. At this time, the inserting and removing hand 60 grasps the flange portion 55 to remove the pin 50. FIG. 10B illustrates the substrate 10 from which all of the pin 50 are removed.

After that, the substrate 10 is cut out for each of the plural semiconductor chips 18 mounted on the substrate 10. A mold process for sealing the semiconductor chips 18 with a resin is performed after the cutout process. As mentioned above, a semiconductor device 1a with a single semiconductor chip 18 and a cutout substrate 10a is thus manufactured.

As illustrated above, the warpage of the substrate 10 can be corrected by the pin 50. For example, when the warpage is corrected by constantly pressing the substrate on the stage by means of the pressing member, the semiconductor chip cannot be mounted on a contact portion in which the pressing portion abuts with the substrate. Therefore, the mounting area is made smaller, thereby increasing the cost. In a case where a gel-like material having adhesive properties coats the stage to correct the warpage of the substrate with its adhesive force, the maintenance for the adhesive force is needed, thereby increasing the cost. As is described in the present embodiment, the mounting area can be ensured and the maintenance is eliminated by means of the pin 50, thereby correcting the warpage of the substrate at a low cost. In the present embodiment, an example of a flip-chip mounting is described. The present invention is not limited to the above example. A general printed substrate such as a SMT (Surface Mounting Technology) substrate may be employed, for example.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. A semiconductor device producing method comprising:
vacuum adsorbing a printed substrate on a stage with the printed substrate being pressed on a vacuum adsorption surface of the stage;
temporarily fixing the printed substrate on the stage by commonly inserting a pin coated with an elastic material to a through hole formed in the printed substrate and a hole formed in the stage in accordance with an elastic restoring force of the elastic material of the pin; and
temporarily fixing the printed substrate on the stage by only the pin after the vacuum adsorption is released.

2. The semiconductor device producing method according to claim 1, further comprising:
mounting a semiconductor chip on the printed substrate after the vacuum adsorption is released;
filling a liquid resin between the printed substrate and the semiconductor chip;
hardening the liquid resin; and
removing the pin after the liquid resin is hardened.

* * * * *